United States Patent
Manikam et al.

(10) Patent No.: US 8,062,424 B2
(45) Date of Patent: Nov. 22, 2011

(54) METHOD AND APPARATUS FOR MOLDING SUBSTRATE

(75) Inventors: Vermal Raja Manikam, Shah Alam (MY); Boon Yew Low, Petaling Jaya (MY); Vittal Raja Manikam, Shah Alam (MY)

(73) Assignee: Freescale Semiconductor, Inc., Austin, TX (US)

( * ) Notice: Subject to any disclaimer, the term of this patent is extended or adjusted under 35 U.S.C. 154(b) by 75 days.

(21) Appl. No.: 12/617,734

(22) Filed: Nov. 13, 2009

(65) Prior Publication Data

US 2011/0115125 A1    May 19, 2011

(51) Int. Cl.
  *B29B 7/10*  (2006.01)
  *B29B 7/26*  (2006.01)
  *B01F 13/06* (2006.01)
(52) U.S. Cl. .............. 118/612; 222/146.1; 222/526; 222/572; 366/184

(58) Field of Classification Search .................. 118/256, 118/612; 222/146.1, 526, 531, 572; 366/184
See application file for complete search history.

(56) References Cited

U.S. PATENT DOCUMENTS

| | | | | |
|---|---|---|---|---|
| 1,989,800 | A * | 2/1935  | Gustin            | 118/612 |
| 3,239,199 | A * | 3/1966  | Jameson           | 241/110 |
| 3,253,303 | A * | 5/1966  | Bradt             | 425/130 |
| 3,291,672 | A * | 12/1966 | Sonneborn et al.  | 156/289 |
| 3,412,431 | A   | 11/1968 | Lemelson          |         |
| 3,717,121 | A * | 2/1973  | Bruckbauer et al. | 118/324 |
| 5,100,699 | A * | 3/1992  | Roeser            | 427/256 |
| 6,527,430 | B2* | 3/2003  | Osborn            | 366/97  |

* cited by examiner

*Primary Examiner* — Robert B Davis
(74) *Attorney, Agent, or Firm* — Charles Bergene

(57) ABSTRACT

A method for encapsulating a substrate includes placing a hardened encapsulant material in a container. The encapsulant material is then heated and stirred until it is in a liquid or gel state. The liquid encapsulant material is held in the container in a vacuum state and dispensed over semiconductor dies along a guide, which allows the liquid encapsulant material to cool slightly before it covers a die.

5 Claims, 4 Drawing Sheets

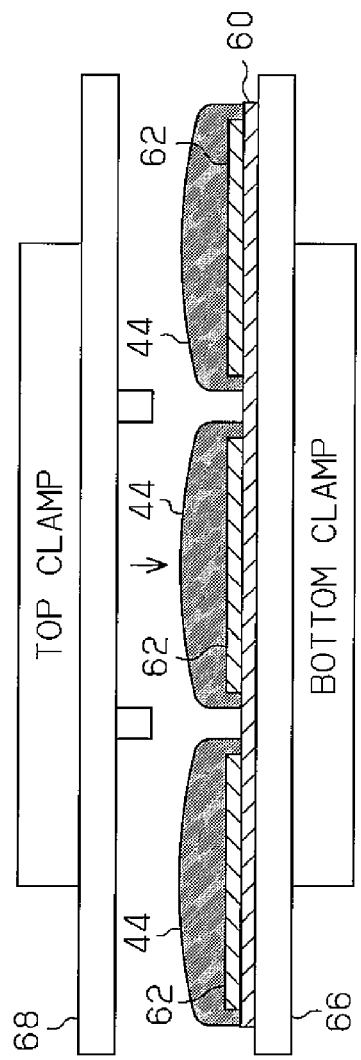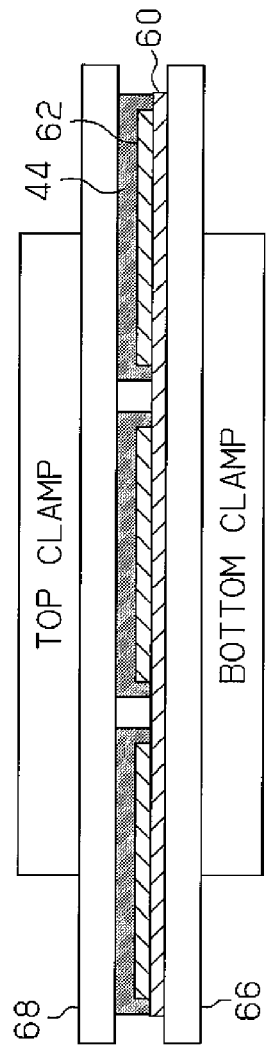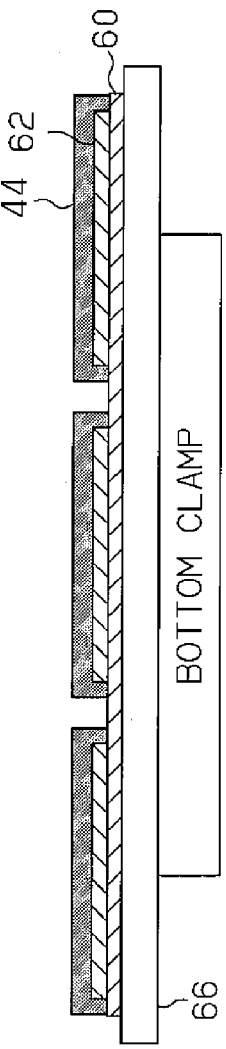

METHOD AND APPARATUS FOR MOLDING SUBSTRATE

BACKGROUND OF THE INVENTION

The present invention relates to a method and apparatus for encapsulating a semiconductor device disposed on a substrate as part of a semiconductor packaging process.

When manufacturing semiconductor devices, a large number of devices are laid out on a large substrate. To improve manufacturing efficiency, there is a tendency for even more devices to be laid out on the same substrate. This has increased the density of devices on a substrate. Generally, as shown in FIG. 1, semiconductor devices 10 are laid out in an array on a substrate 12. Each semiconductor device 10 on the substrate 12 is covered with a mold material. There are various ways to cover the devices with the mold material. For example, referring to FIG. 2, two or more (e.g., four) semiconductor dies 14, 16, 18, and 20 are stacked and encapsulated with a mold compound 22 to form a single one of the devices 10. The device 10 is referred to as a stacked die.

There are various machines available to mold the devices 10 on the substrate 12. A conventional molding apparatus is described in U.S. Pat. No. 3,412,431. This molding apparatus uses a deposition/spray method to spray mold material from a nozzle and deposit the mold material onto a molding subject. However, with the deposition/spray method, as the density of devices on a substrate increases, a mold void or incomplete fill may be formed between the substrate and semiconductor die. This problem is particularly critical with stacked die devices. Accordingly, it is difficult to mold a substrate (device) without causing mold voids, incomplete fills, or wire sweeps. Defective molding lowers the yield of semiconductor products, which increases the time and cost of production. The deposition/spray method also has a tendency of wasting the mold material.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIGS. 6A, 6B, and 6C are schematic diagrams illustrating additional steps in the substrate encapsulation process of FIG. 5.

DETAILED DESCRIPTION OF THE INVENTION

The present invention provides a method of encapsulating a plurality of semiconductor devices disposed on a substrate and an apparatus for encapsulating a plurality of semiconductor devices mounted on a substrate. The method and apparatus help prevent defects that may occur during the encapsulation process.

One aspect of the present invention is a method for encapsulating a substrate where a plurality of semiconductor devices is mounted on the substrate. The method includes placing an encapsulation material in a container, maintaining a vacuum environment in the container, heating and melting the encapsulation material into a liquid form, and dispensing the liquid encapsulation material as a liquid layer onto the substrate from a dispense opening of the container.

A further aspect of the present invention is an apparatus for encapsulating a substrate. The apparatus includes a container for holding an encapsulation material. A vacuum pump is operably connected to the container. A heater proximate to or integral with the container heats and melts the encapsulation material into a liquid state. A dispense opening arranged in the container allows the liquid encapsulation material to be dispensed.

Figure 1:
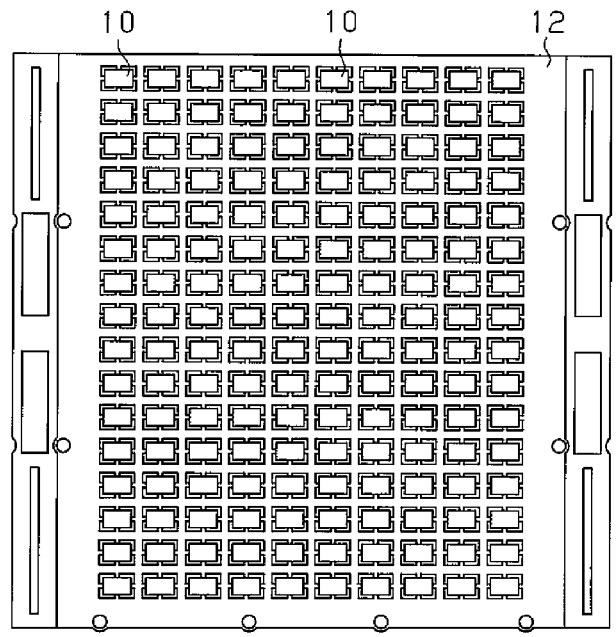
FIG. 1 is a schematic plan view illustrating a conventional semiconductor substrate on which a plurality of semiconductor devices are densely disposed.
Figure 2:
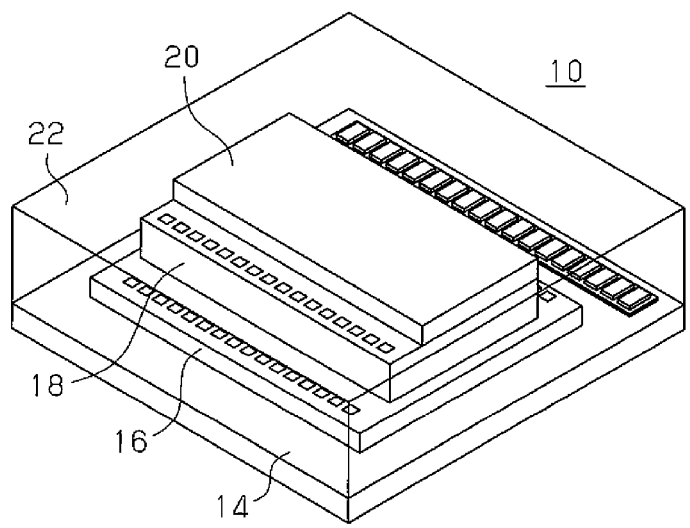
FIG. 2 is an enlarged view illustrating a conventional stacked die semiconductor device.
Figure 3:
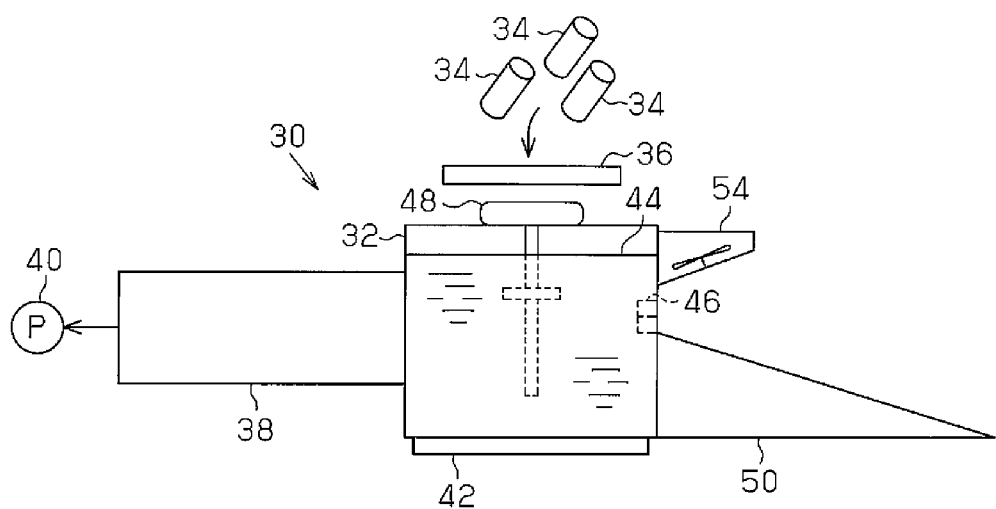
FIG. 3 is a side view of a dispenser head of an encapsulation apparatus in accordance with one embodiment of the present invention.

An encapsulation apparatus in accordance with one embodiment of the present invention will now be discussed with reference to the drawings. FIG. 3 shows a dispenser head 30, which is part of the encapsulation apparatus. The dispenser head 30 includes a container 32 for holding an encapsulation material. The encapsulation material comprises a polymer sealant, such as a mold compound. The container 32 holds the encapsulation material in the form of pellets 34. This reduces the necessary floor space required to prepare and store the encapsulation material. The container 32, for example, includes an upper opening through which the pellets 34 are fed into the container 32. A lid or cover 36 is used to close or seal the upper opening of the container 32.

The container 32 is connected by a tube or hose 38 to a vacuum pump 40. The vacuum pump 40 pumps atmospheric air out of the container 32 after the container 32 has been sealed shut with the lid 36 with the pellets 34 inside the container 32. When an encapsulation process is being performed, the vacuum pump 40 maintains the interior of the container 32 in a vacuum state.

A heater 42 is located near to or is integral with the container 32. In the example shown in FIG. 3, the heater 42 is disposed to a lower surface of the container 32. However, the heater 42 may also be located near to other parts of the container 32, such as a side wall. The heater 42 may also be arranged inside the container 32. The heater 42 operates to heat and melt the pellets 34 to a liquid state. The encapsulation material in the container 32 is shown as melted or liquid polymer sealant 44. In other words, the heater 42 heats and transforms the pellets 34 into the liquid polymer sealant 44 that can be used to encapsulate a semiconductor die.

The container 32 has a front wall (right wall as viewed in FIG. 3). A dispenser opening or nozzle 46 is arranged in the front wall. In the example shown in FIG. 3, a plurality of nozzles 46 are concentrated in an area near the middle of the front wall of the container 32. However, the nozzles 46 may be arranged next to one another in a straight line that extends sideways. The dispenser opening is not limited to a nozzle and may be shaped as a slot or slit that extends sideways. The nozzles 46 are used to slowly dispense the liquid polymer sealant 44.

The dispenser head 30 further includes an agitator 48 arranged in the container 32. The agitator 48 is a mixer that rotates agitation vanes located along a rotation shaft. The agitator 48 stirs or agitates the pellets 34 located in the container 32 while or after the pellets 32 have been melted by the heat produced by the heater 42. Agitation keeps the liquid polymer sealant 44 homogeneous and eliminates bubbles from the liquid polymer sealant 44. Preferably, the agitation of the liquid polymer sealant 44 and the heating of the pellets 34 are performed substantially at the same time. This makes the pellet melting operation efficient because the pellets 34 are uniformly heated. Alternatively, the agitation may be started after the pellets 34 are melted (or after heating the pellets 34 for a predetermined time or when the pellets (mold material) reach either a predetermined temperature or viscosity. A timer, temperature sensor, or viscosity sensor can be used to determine the desired state of the mold material in the container 32. Further, the heating and agitation operations may be performed while the liquid polymer sealant 44 is being dispensed from the container 32 via the nozzles 46.

The dispenser head 30 also preferably includes a guide 50, which guides the liquid polymer sealant 44 from the nozzles 48 to a target, which as will be described in detail below, is a substrate. The guide 50 is coupled to the container 32. The guide 50 comprises, for example, a sloped member having a sloped surface along which the liquid polymer sealant 44 flows.

Figure 4:
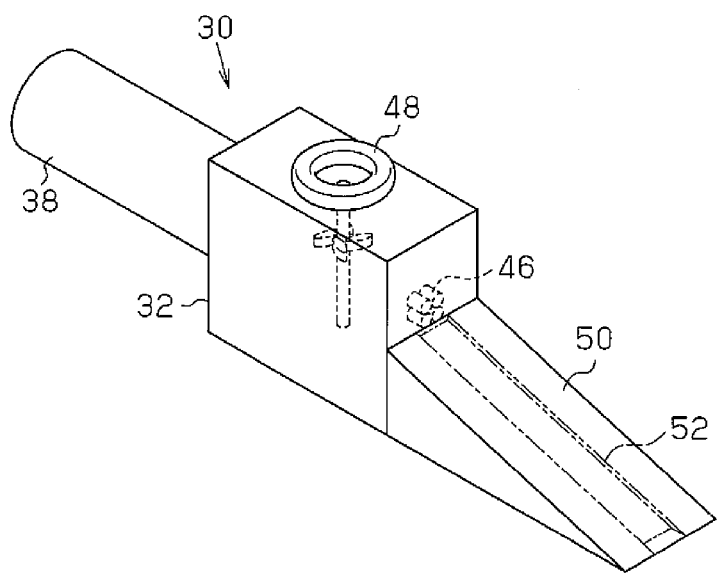
FIG. 4 is a partial perspective view illustrating the dispenser head of FIG. 3.

Referring to FIG. 4, the sloped surface of the guide 50 may optionally have a guide channel 52. The guide channel 52 is preferably formed in correspondence with the location of the nozzles 48 (or width of dispense opening) and is used to guide the flow of the liquid polymer sealant 44. The guide channel 52 may be rectangular (as shown), oval, or otherwise shaped. Further, the distal end of the guide channel 52 may be flared (not shown). Alternatively, the sloped surface of the guide 50 may just be a flat surface. As another option, the guide 50 may be a tubular slot (tube having an opening elongated sideward) that is in communication with the nozzles 48.

The liquid polymer sealant 44 cools as it flows down the guide 50 (from the nozzles 46 to the distal end of the guide 50 due to the temperature of the air (ambient air temperature). Compared to when the guide 50 is not used, the liquid polymer sealant 44 flows more slowly when the guide 50 is used. The heater 42 maintains the temperature of the liquid polymer sealant 44 high in the container 32. Thus, the liquid polymer sealant 44 flows out of the nozzles 48 at a relatively high speed. As the liquid polymer sealant 44 flows along the guide 50, the liquid polymer sealant 44 cools, which slows the flow of the liquid polymer sealant 44. Further, by cooling the liquid polymer sealant 44 on the guide 50, the liquid polymer sealant 44 remains gel-like on the guide 50. As a result, the gel-like liquid polymer sealant 44 will cover the mold target with a uniform, a single layer.

To effectively cool the liquid polymer sealant 44, a cooling device 54 may be arranged near the nozzles 48 and the guide 50. For example, referring to FIG. 3, the cooling device 54 may be a fan or a blower that produces an air curtain for cooling the liquid polymer sealant 44 on the guide 50. When using a fan as the cooling device 54, the cooling device 54 is arranged on the upper portion of the front wall of the container 32 (as shown). The cooling device 54 cools the liquid polymer sealant 44 so that it does not flow too fast. This maintains the liquid polymer sealant 44 in an appropriate gel-like state so that the liquid polymer sealant 44 is applied to the target area with an even thickness (layer thickness). Although not shown in the drawings, the cooling device 54 may be arranged near the guide 50.

In one embodiment of the invention, the guide 50 also functions as a movable blade for closing the nozzles 48 and stopping dispensing of the liquid polymer sealant 44. For instance, the guide 50 itself may be movable vertically so that it moves upwards until it covers or blocks the nozzles 46, which stops the flow of the mold material 44. The guide 50 is arranged to move upward and downward with respect to the container 32. The guide 50 moves downward when the liquid polymer sealant 44 is dispensed from the nozzles 48. From this state (lowered state), the guide 50 moves upward, closing the nozzles 48 and stopping the dispensing of the liquid polymer sealant 44. This mechanism allows for the dispensing of the liquid polymer sealant 44 to be started and stopped with a simple structure. Alternatively, the guide 50 may include a discrete movable blade (not shown) that moves up and blocks the nozzles 46.

Although not shown in the drawings, a controller or computer is used to control the driving and operation time of the heater 42, the agitator 46, the cooling device 56, and the vacuum pump 40. However, such controllers are well known in the manufacturing arts and thus a detailed description thereof is not required for a complete understanding of the present invention.

A process for encapsulating a substrate 60 with the molding apparatus (dispenser head 30) will now be discussed with reference to FIGS. 5 and 6.

Figure 5:
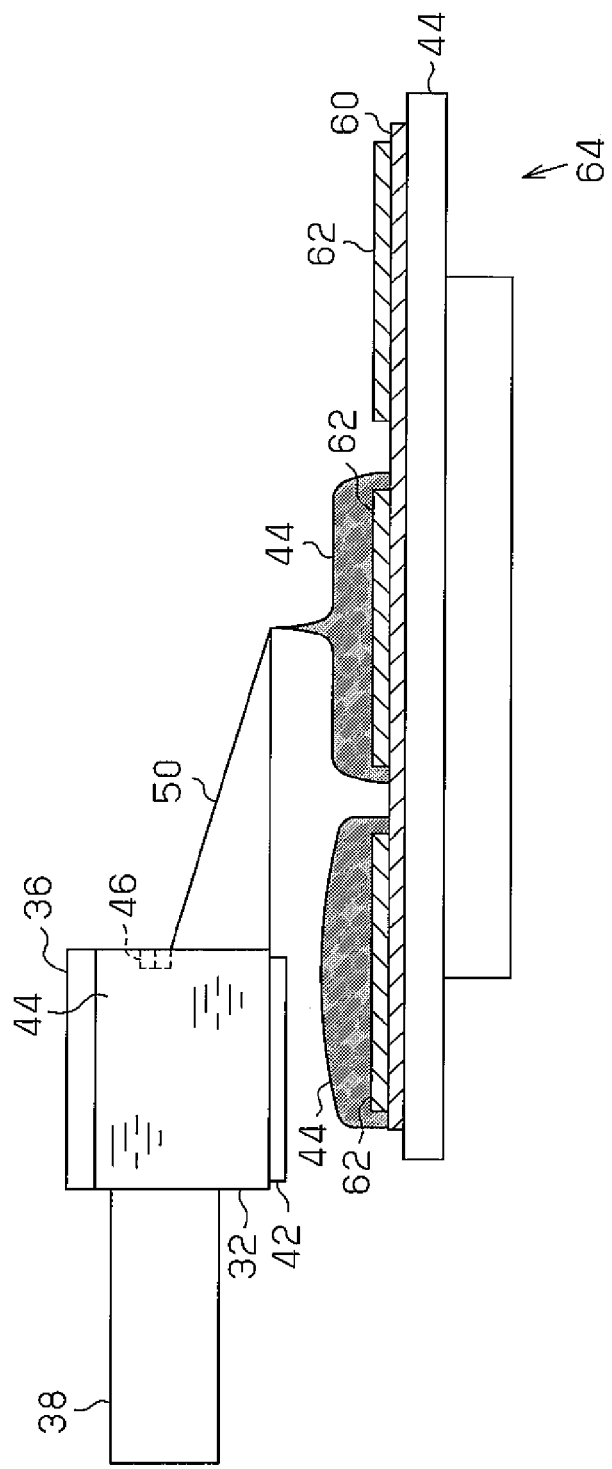
FIG. 5 is a schematic diagram illustrating a substrate encapsulation process using the dispenser head shown in FIG. 3.

FIG. 5 illustrates part of the encapsulation process. A large number of semiconductor devices 62 are arranged in an array on the substrate 60. FIG. 5 shows each device 62 formed as a single semiconductor die. However, one or more of the devices 62 may be a stacked die device having 2, 3 or more dies stacked one atop another. The substrate 60 is fixed to a clamping device 64, which is subsequently used when a compression molding step is performed. The clamping device 64 includes a lower or bottom clamp 66 and an upper or top clamp 68 (FIG. 6). The substrate 60 is held on the lower clamp 66.

The molding apparatus supports the dispenser head 30 so that the dispenser head 30 is horizontally movable over the entire substrate 60 together with the hose 38, which is connected to the vacuum pump 40. A controller such as a computer or microprocessor system, or microcontroller controls the movement of the dispenser head 30. When moving the dispenser head 30, the computer prevents the dispenser head 30 from coming into contact with the substrate 60 and dies 62. Thus, in one embodiment, the dispenser head 30 is moved along the top of the substrate 60, while in an alternative embodiment, the dispenser head 30 could be substantially stationary and the substrate 60 could be moved relative to the dispenser head 30.

As shown in FIG. 5, while horizontally moving across the substrate 60, which is fixed to the lower clamp 66, the dispenser head 30 dispenses the liquid polymer sealant 44 over each die 62 sequentially. The dispenser head 30 may be continuously moved without stopping. Alternatively, the dispenser head 30 may be stopped for an instant whenever reaching a position between dies 62. When continuously moved, the dispenser head 30 dispenses the liquid polymer sealant 44 so that the sealant 44 is applied over the entire substrate 10. The moving speed of the dispenser head 30 may be adjusted or controlled. Preferably, when the dispenser head 30 moves between dies 62, the guide 50 temporarily stop the dispensing of the sealant 44 by blocking the nozzles 46. This minimizes waste of the liquid polymer sealant 44. In one embodiment, as shown in FIG. 5, the dispenser head 30 temporarily stops at a position above each die 62 and dispenses the necessary amount of the liquid polymer sealant 44 onto the die 62. In this manner, the dispenser head 30 dispenses a liquid layer of the liquid polymer sealant 44 from the nozzles 46. This effectively eliminates mold voids between semiconductor dies and incomplete fills.

FIG. 6 illustrates a compression molding process that is performed after the sealant 44 has been dispensed over the dies 62. The compression molding process is performed to obtain a final shape of the packaged device. As shown in FIG. 6A, the upper clamp 68 is lowered and fixed to the lower clamp 66, which holds the substrate 60. As shown in FIG. 6B, the liquid polymer sealant 44 is compressed onto the semiconductor dies between the lower and upper clamps 66 and 68. This shapes the devices to predetermined dimensions. When the compression molding is completed, the upper clamp 68 is raised as shown in FIG. 6C. Molded strips obtained through the compression molding then undergo post-mold curing to be hardened.

The encapsulation apparatus and method described above have many advantages. The liquid polymer sealant 44 is dispensed from the nozzles 48 in a liquid layer. This effectively prevents mold voids between semiconductor dies and incomplete fills of the liquid polymer sealant 44, which cannot be prevented with the conventional spray type apparatus. The encapsulation method disclosed herein is especially advantageous for large substrates that are densely populated with semiconductor dies, and substrates having stacked dies. In comparison with the conventional spray type method, the method described above dispenses the liquid polymer sealant 44 in a liquid layer does not waste material and is thus cost-efficient and economical.

The liquid polymer sealant 44 is heated and agitated in the container 32 while in a vacuum state before being dispensed. This keeps the liquid polymer sealant 44 homogeneous and eliminates bubbles. Thus, molding defects are reduced and the manufacturing yield is improved. Further, the package reliability is increased.

The liquid polymer sealant 44 is dispensed from the nozzles 48 along the guide 50. The temperature of the liquid polymer sealant 44 is lowered as it travels along the guide 50, which slows the flow of the sealant 44 and allows the sealant to gel. This allows the dies on the substrate to be covered with a relatively uniform layer having an even thickness.

The cooling device 54 assists in cooling the liquid polymer sealant 44. This keeps the liquid polymer sealant 44 in a gel-like state and further adjusts the flow speed and layer thickness.

The container 32 holds the liquid polymer sealant 44 in the form of the pellets 34. In other words, the same container 32 holds and heats (melts) the pellets 34. This allows for the size of the dispenser head 30 to decreased. In addition, the dispenser head 30 is horizontally movable over the entire substrate 10. Thus, the large number of devices 12 on the substrate 10 may be molded with a continuous process. After the liquid polymer sealant 44 is applied to each die 62 on the substrate 60, the dies 62 undergo compression molding. This sizes the devices with accurate dimensions.

It should be apparent to those skilled in the art that the present invention may be embodied in many other specific forms without departing from the spirit or scope of the invention. Particularly, it should be understood that the present invention may be embodied in the following forms.

The encapsulation material in the container 32 does not have to be placed into the container 32 in the form of pellets 34. For example, the encapsulation material could be melted beforehand and then poured or pumped into the container 32.

The present examples and embodiments are to be considered as illustrative and not restrictive, and the invention is not to be limited to the details given herein, but may be modified within the scope and equivalence of the appended claims.

What is claimed is:

1. An apparatus for encapsulating a semiconductor die attached to a substrate, the apparatus comprising:
    a container for holding an encapsulation material;
    a vacuum pump operably connected to the container for creating a vacuum state within the container;
    a heater for heating the encapsulation material in the container to a liquid state;
    an agitator for agitating the encapsulation material in the container;
    a dispense opening in the container through which the liquid encapsulation material is dispensed onto the semiconductor die; and
    a guide connected to the container that guides the liquid encapsulation material dispensed from the dispense opening to the substrate, wherein the guide includes a sloped member having a sloped surface along which the liquid encapsulation material flows.

2. The encapsulation apparatus of claim 1, wherein the guide is movable between a first position in which liquid encapsulation material may be dispensed from the container and a second position in which the guide blocks the dispense opening and stops dispensing of the liquid encapsulation material.

3. The encapsulation apparatus of claim 1, further comprising a cooling device arranged near the dispense opening which cools the liquid encapsulation material dispensed from the dispense opening.

4. The encapsulation apparatus of claim 1, further comprising a lid that covers and seals the container.

5. A dispenser head for an encapsulation apparatus for covering a semiconductor die attached to a substrate with a polymer sealant, the apparatus comprising:
    a container for holding the polymer sealant, wherein the polymer sealant is placed into the container in a solid state;
    a lid for sealing the container;
    a vacuum pump operably connected to the container for creating a vacuum state within the container;
    a heater for heating and melting the polymer sealant in the container to a liquid state;
    a nozzle in the container through which the liquid polymer sealant may exit the container;
    an agitator inside the container for agitating the liquid polymer sealant;
    a guide disposed below the nozzle for receiving the liquid polymer sealant and guiding the liquid polymer sealant over the semiconductor die; and
    a cooling device located near the guide for cooling the liquid polymer sealant from a liquid state to a gel-like state after the liquid polymer sealant exits the container by way of the nozzle.

* * * * *